United States Patent
Forster et al.

(10) Patent No.: US 9,391,352 B2
(45) Date of Patent: Jul. 12, 2016

(54) LIMITER FOR BROADBAND HIGH-FREQUENCY SIGNALS

(71) Applicant: Rohde & Schwarz GmbH & Co. KG, Munich (DE)

(72) Inventors: Josef Forster, Haslach (DE); Roland Ahlers, Siegertsbrunn (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 388 days.

(21) Appl. No.: 14/073,095

(22) Filed: Nov. 6, 2013

(65) Prior Publication Data
US 2014/0125545 A1    May 8, 2014

(30) Foreign Application Priority Data

Nov. 6, 2012 (DE) .......................... 10 2012 220 133
Apr. 2, 2013 (DE) .......................... 10 2013 205 805

(51) Int. Cl.
*H01P 1/22* (2006.01)
*H03G 11/00* (2006.01)
*H03G 11/02* (2006.01)
*H01Q 1/50* (2006.01)

(52) U.S. Cl.
CPC .. *H01P 1/22* (2013.01); *H01Q 1/50* (2013.01); *H03G 11/002* (2013.01); *H03G 11/02* (2013.01)

(58) Field of Classification Search
CPC .......... H01P 1/22; H01Q 1/50; H03G 11/002; H03G 11/02; H03G 11/00; H03G 11/025; H03K 17/08
See application file for complete search history.

(56) References Cited

U.S. PATENT DOCUMENTS

| | | | | |
|---|---|---|---|---|
| 3,573,774 A | * | 4/1971 | Olsen ..................... | G08C 19/08 323/909 |
| 6,195,245 B1 | * | 2/2001 | Kobsa ..................... | H04M 3/18 361/119 |
| 6,377,434 B1 | * | 4/2002 | Martineau ................ | H01C 1/16 361/106 |
| 6,518,815 B2 | * | 2/2003 | Grimaldi ............ | H03K 17/0822 327/310 |
| 7,159,236 B2 | * | 1/2007 | Abe ......................... | H04B 1/40 375/222 |
| 8,027,136 B2 | | 9/2011 | Penwell et al. | |
| 2009/0001527 A1 | * | 1/2009 | Mondi ................ | H01L 23/3677 257/656 |
| 2010/0277839 A1 | | 11/2010 | Nicholson et al. | |
| 2011/0255204 A1 | * | 10/2011 | Satomi ................. | H03G 11/025 361/111 |

FOREIGN PATENT DOCUMENTS

| | | |
|---|---|---|
| DE | 198 04 589 C1 | 11/1999 |
| JP | 0648342 U | 6/1994 |
| JP | 2006031508 A | 2/2006 |

* cited by examiner

Primary Examiner — Jung Kim
(74) Attorney, Agent, or Firm — Carter, DeLuca, Farrell & Schmidt, LLP

(57) ABSTRACT

A limiter for high-frequency signals has an input, whereas the high-frequency signal is supplied to the limiter at its input. The limiter provides several limiting stages which are electrically connected to the input. Each limiting stage is a series circuit with an unbiased diode and a Zener diode which does not serve to bias the diode, so that the high-frequency signal is electrically connected to a reference ground via the one unbiased diode and the Zener diode.

15 Claims, 3 Drawing Sheets

LIMITER FOR BROADBAND HIGH-FREQUENCY SIGNALS

FIELD

The invention relates to a limiter for broadband high-frequency signals, especially as used in radio devices. It claims priority of German patent applications DE 10 2012 220 133.5 of Nov. 6, 2012 and DE 10 2013 205 805.5 of Apr. 2, 2013.

Dependent upon the spacing distance between transmitter and receiver, the reception level of a high-frequency signal at the location of the receiver can have strongly different amplitudes. For example, if two vehicles each with a radio device travel in direct proximity to one another, the amplitude of the high-frequency signal which is transmitted from the first vehicle and is received, inter alia, directly by the second vehicle, can be very high in the latter. In order to avoid damage to the receiver unit of the radio device, limiters which limit the high-frequency signal are therefore used.

BACKGROUND

A circuit is known from US 2010/0277839 A1 which protects a switching circuit connected to it from an excessively high amplitude of a high-frequency signal. In this context, the circuit comprises a detection unit, which detects a high-frequency signal with an excessively high level, and a switch unit, which comprises PIN diodes (English: positive intrinsic negative diode; German: positiv intrinsische negative Diode), which limits the high-frequency signal dependent upon the result determined by the detection unit. The disadvantage with US 2010/0277839 A1 is that the circuit construction is complex and, with a detection unit and a switch unit, requires two different circuit stages. This active control circuit is also very complex because of the control transistors used and the generation of the supply voltages for the detector diodes and the control transistors.

SUMMARY

An object of the present invention is therefore to provide a limiter for a high-frequency signal which reliably protects the circuit connected to it from high amplitudes of the high-frequency signal and is constructed, in this context, very simply, and a radio device with such a limiter.

The limiter according to the invention for high-frequency signals provides an input, whereas a high-frequency signal is supplied to the limiter at its input. The limiter also provides at least one limiting stage, which is electrically connected to the input. The limiting stage comprises a series circuit with an unbiased diode and a Zener diode, which, differently from the case of US 2010/0277839 A1, does not serve to bias the diode, so that the high-frequency signal is electrically connected to a reference ground via an unbiased diode and the Zener diode. By contrast with US 2010/0277839 A1, this is a purely passive switching circuit, which still functions even when the supply voltage is switched off.

It is particularly advantageous that the limiting stage comprises a series circuit which is constructed from an unbiased diode and a Zener diode which does not serve to bias the diode, because no further voltage sources which would need to be decoupled from the high-frequency signal are necessary for correct functioning. The series circuit between the diode and the Zener diode causes the high capacitance of the Zener diode to be reduced by the low capacitance of the diode, whereby, in the non-limiting operating case, the insertion loss can be kept low. The use of the series circuit also means that the limiting increases more strongly from the breakdown voltage than with the use of a Zener diode alone.

Furthermore, an advantage is achieved with the limiter according to the invention for high-frequency signals if the high-frequency signal is present at an anode of a first diode in the positive limiting stage, and if the cathode of the first diode is electrically connected to a cathode of a first Zener diode, and if the anode of the first Zener diode is electrically connected to the reference ground, because, in this manner, the positive limiting stage limits a positive half-wave of the high-frequency signal. An advantage is also achieved if the high-frequency signal is present at a cathode of a second diode of a negative limiting stage, and if an anode of the second diode is electrically connected to an anode of a second Zener diode, and if a cathode of the second Zener diode is electrically connected to the reference ground, because, as a result, the negative limiting stage limits a negative half-wave of the high-frequency signal. The at least one limiting stage can consequently be embodied as a positive limiting stage or as a negative limiting stage.

Furthermore, it is particularly advantageous, if the limiter provides an output, where the output is electrically connected to the input via a line element, and if the limiter provides at least two positive limiting stages, which limit a positive half-wave of the high-frequency signal and/or if the limiter provides at least two negative limiting stages, which limit a negative half-wave of the high-frequency signal, and/or if the at least two positive limiting stages which limit the positive half-wave, and/or if the at least two negative limiting stages which limit the negative half-wave are connected at different connecting points of the line element. In this context, it is particularly advantageous that a higher thermal power loss can be absorbed through the use of several parallel limiting stages.

Furthermore, it is particularly advantageous, if, in the case of the limiter according to the invention, a spacing distance between every connecting point amounts to one quarter or approximately one quarter of the wavelength of the high-frequency signal, or if the spacing distance between every connecting point amounts to approximately zero wavelengths. This means that, if the first limiting stage, which limits, for example, a positive half-wave of the high-frequency signal, and accordingly lowers the potential at a first connecting point to the potential of the reference ground, then the potential at the connecting point which is one quarter of the wavelength of the high-frequency signal away from the first connecting point, again adopts a maximum, so that the Zener diode in the second limiting stage also breaks down safely and limits the high-frequency signal. In the following limiting stages, the limiting should preferably begin from a relatively lower amplitude than in the first limiting stage, if the limiting stages are spaced from one another at approximately one quarter of the wavelength of the high-frequency signal. Even if the spacing distance does not correspond exactly to one quarter of the wavelength, the amplitude of the high-frequency signal can still be disposed above the breakdown voltage, so that the spacing distance is selected in such a manner that it preferably corresponds to one quarter of the wavelength, but is still so large, that the present amplitude of the high-frequency signal leads to the limiting by the subsequent, that is, spaced, further limiting stage.

Furthermore, an advantage is achieved with the limiter according to the invention if, in the line element, a first inductance is connected, of which the level is selected in such a manner that the depletion-layer capacitance of every diode and every Zener diode within every limiting stage is compensated for a first operating frequency.

Furthermore, an advantage is achieved with the limiter according to the invention if, in each case at least one additional inductance of which the level is selected in such a manner that the depletion-layer capacitance of every diode and every Zener diode within every limiting stage is compensated for a different operating frequency is connected in parallel or in series via at least one first switch to the first inductance. This allows several additional inductances to be connected, so that the influence of the diodes and the Zener diodes is compensated at different operating frequencies.

Furthermore, an advantage is achieved with the limiter according to the invention if at least one limiting stage is electrically connected to a line element in a detachable manner via at least one second switch. This allows several limiting stages to be connected additionally. These further limiting stages, which are electrically connectable, can limit the high-frequency signal, for example, to an even lower amplitude. For this purpose, Zener diodes which have a relatively lower breakdown voltage by comparison with the Zener diodes which are used in the limiting stages which are rigidly connected to the line element can be used in these limiting stages. The switch can then also be closed when the thermal loading of the other limiting stages has been reached, or so that the existing inductances and depletion-layer capacitances can be compensated for yet another operating frequency. In this context, the switches are, for example, PIN diodes or also mechanical switches, which can be activated, for example, manually.

Furthermore, it is advantageous with the limiter according to the invention if every diode is a PIN diode, because the depletion-layer capacitances of a PIN diode are very low. It is also particularly advantageous if the diode and/or the Zener diode provide a MELF construction (English: metal electrode faces; German: metallene Elektrodenfront), because these can be cooled particularly readily as a result and have a large resistance to high temperatures. In this context, it is also advantageous if the limiter contains a printed-circuit board, on which the at least one limiting stage is arranged, because this significantly simplifies the construction, and the production can be implemented in a largely automated manner.

It is also particularly advantageous if the limiter according to the invention provides a gap pad (German: Lückenbelag), and if the gap pad is arranged in an airtight manner on the at least one limiting stage for heat absorption. The resulting low thermal-transfer resistance allows reliable heat removal from the individual limiting stages.

In this context, the limiter according to the invention can be connected within a radio device which is additionally connected to an antenna. The limiter also operates when the radio device is disconnected from the power supply. Such a radio device can be installed, for example, in a vehicle, but also in an aircraft or ship.

BRIEF DESCRIPTION OF THE DRAWINGS

Various exemplary embodiments of the invention are described by way of example below with reference to the drawings. Identical subject matters provide the same reference numbers. The corresponding Figures of the drawings show in detail.

DETAILED DESCRIPTION

Figure 1:
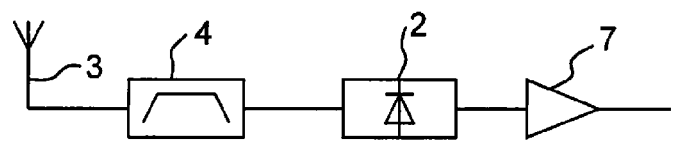
FIG. 1 an overview circuit diagram of a part of a radio device which provides the limiter according to the invention for broadband high-frequency signals.

FIG. 1 shows an overview circuit diagram of a part of a radio device 1 which provides the limiter 2 according to the invention for broadband high-frequency signals. In this context, an antenna 3 is connected to the limiter 2 via a bandpass 4. The antenna 3 can, optionally, also be directly connected to an input 5 of the limiter 2. An output 6 of the limiter 2 is preferably connected to a low-noise amplifier (English: low-noise amplifier (LNA)) 7. In this context, the limiter 2 serves to limit high amplitudes within the high-frequency signal received from the antenna 3 to an amplitude which is not damaging for the downstream electronics. This is relevant especially if a transmitter is arranged close to a receiver. By preference, the limiter 2 according to the invention should operate without an additional power supply, so that, even with a switched-off radio device 1, the electronics are protected from an excessively high level value.

Figure 2A:
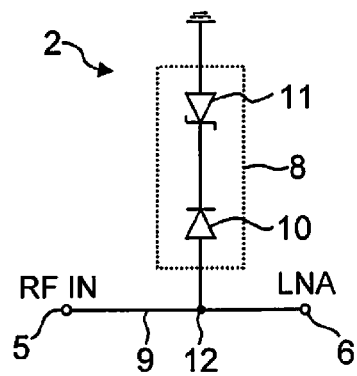
FIG. 2A a limiter according to the invention which provides a limiting stage which limits a positive half-wave of the high-frequency signal.

FIG. 2A shows a limiter 2 according to the invention which contains a limiting stage 8. It is readily recognisable that the input 5 is electrically connected to an output 6 via a line element 9. The line element 9 can be a strip conductor on the printed circuit board on which the limiter 2 according to the invention is constructed. However, the line element 9 can also be a cable, a flexible lead or a single wire.

The limiter 2 according to the invention provides at least one limiting stage 8. This at least one limiting stage 8 comprises a series circuit made of precisely one diode 10 and precisely one Zener diode 11. In this context, the diode 10 is unbiased. The Zener diode 11 also does not serve to bias the diode 10. In this context, the limiting stage 8 is connected at one end to the line element 9 and accordingly to the input 5 and to the high-frequency signal. At the other end, the limiting stage 8 is also connected to the reference ground.

As already explained, a limiting stage 8 comprises a series circuit made from a diode 10 and a Zener diode 11. Further components are not contained in the limiting stage 8. In particular, no further elements are connected in series within the series circuit or to the series circuit which comprises the diode 10 and the Zener diode 11. Similarly, no further elements are connected in parallel within the series circuit or to the series circuit, apart from further limiting stages 8, as will be explained in greater detail later. On the one hand, the elements are active components, especially transistors which are not connected in series to the limiting stage, but also passive components, such as capacitors which are connected to the limiting stage in parallel.

The limiting stage 8 can limit a positive half-wave of the high-frequency signal and also a negative half-wave of the high-frequency signal. For the case that the limiting stage 8 limits a positive half-wave, reference will also be made in the following to a positive limiting stage 8. For the case that the limiting stage limits a negative half-wave, reference will also be made in the following to a negative limiting stage. For the case that reference is made only to a limiting stage, the latter may be one which limits either a positive half-wave or a negative half-wave.

The exemplary embodiment from FIG. 2A shows a limiting stage 8 which can limit the positive half-wave of the high-frequency signal. In this case, the high-frequency signal which is connected to the line element 9 is supplied via the input 5 of the limiter 2 according to the invention. The limiting stage 8 is also connected via a connecting point 12 to the line element 9. The connecting point 12 can be a simple branching of the strip conductor on the printed circuit board or a wire respectively a flexible lead can be connected to the line element 9 by means of a soldered or welded connection.

In this context, the first diode 10 and the first Zener diode 11 are arranged in such a manner that the high-frequency signal is present at an anode of the precisely one first diode 10 of the at least one positive limiting stage 8. In this context, a cathode of the first diode 10 is electrically connected to a cathode of the first Zener diode 11. An anode of the first Zener diode 11 is electrically connected to the reference ground.

The first Zener diode 11 ensures that the high-frequency signal is not already limited by the limiter 2 according to the invention from an amplitude of approximately 0.7 volts to the latter for silicon diodes. In this context, the first diode 10 and the second Zener diode 11 are selected in such a manner that the limiter 2 switches off an amplitude of the high-frequency signal at approximately 7-8 Volts. Accordingly, a protection from an excessively high incident high-frequency power, and additionally from overvoltages, is achieved. In this context, a clipped sinusoidal signal assumes a trapezoidal shape. In this context, the first Zener diode 11 has the advantage that the output power of the high-frequency signal and also the scattering loss corresponds to the given specifications, because their characteristic is strongly inflected at their specified voltage. In this context, an additional first diode 10 increases the loss factor.

In this context, the limiter 2 according to the invention takes up only a part of the clipped half-wave directly as energy. By contrast, the predominant part is reflected back to the reference ground at the transition point and radiated via the antenna 3. In this context, approximately 90% of the energy is reflected and only approximately 10% absorbed.

Figure 2B:
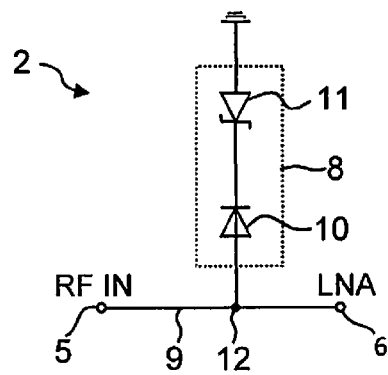
FIG. 2B a further limiter according to the invention which provides a limiting stage which limits a positive half-wave of the high-frequency signal.

FIG. 2B shows a further limiter 2 according to the invention which provides a limiting stage 8 which limits a positive half-wave of the high-frequency signal. Differently from the limiter from FIG. 2A, the first diode in FIG. 2B is a PIN diode 10. The depletion-layer capacitance of such a PIN diode is significantly lower than the depletion-layer capacitance of a conventional diode.

Figure 3A:
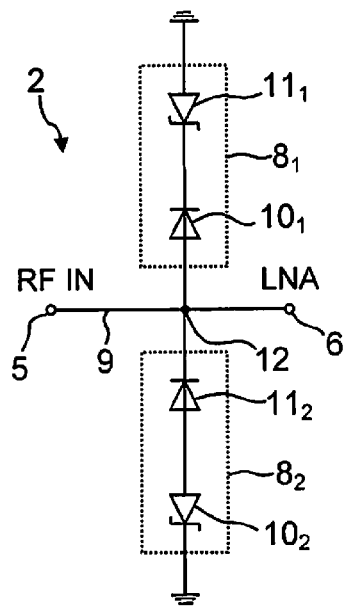
FIG. 3A a limiter according to the invention which provides two limiting stages which limit a positive half-wave and a negative half-wave of the high-frequency signal.

FIG. 3A shows a limiter 2 according to the invention, which provides two limiting stages $8_1$, $8_2$, which limit a positive half-wave and a negative half-wave of the high-frequency signal.

In this context, a positive limiting stage $8_1$ limits a positive half-wave of the high-frequency signal. As already explained, this comprises a series circuit of precisely one first diode $10_1$ and precisely one first Zener diode $11_1$. The first diode $10_1$ is preferably a first PIN diode $10_1$.

In this context, the negative limiting stage $8_2$ limits a negative half-wave of the high-frequency signal. The negative limiting stage $8_2$ is accordingly connected via the connecting point 12 to the line element 9. The high-frequency signal is accordingly present at a cathode of a second diode $10_2$ of the negative limiting stage $8_2$ for the negative half-wave. In this context, an anode of the second diode $10_2$ is electrically connected to an anode of a second Zener diode $11_2$. A cathode of the second Zener diode $11_2$ of the at least one negative limiting stage $8_2$ for the negative half-wave is accordingly electrically connected to the reference ground. The second diode $10_2$ is also preferably a second PIN diode $10_2$. Both diodes $10_2$ and $11_2$ preferably provide a MELF construction. The negative limiting stage $8_2$ for the negative half-wave of the high-frequency signal also absorbs only a part of the energy of the negative half-wave. Most of the energy is also reflected at the reference ground and radiated via the antenna 3.

Figure 3B:
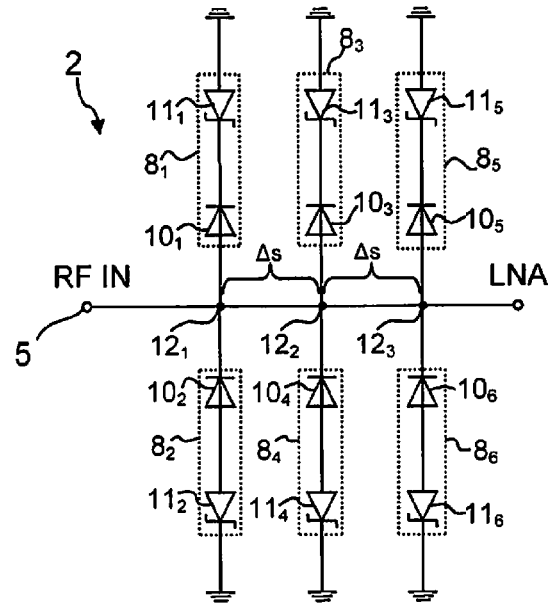
FIG. 3B a limiter according to the invention which provides six limiting stages arranged in parallel which limit a positive half-wave and a negative half-wave of the high-frequency signal.

FIG. 3B shows a limiter 2 according to the invention, which provides six limiting stages $8_1$, $8_2$, $8_3$, $8_4$, $8_5$, $8_6$ arranged in parallel, which limit a positive half-wave and a negative half-wave of the high-frequency signal. In the exemplary embodiment from FIG. 3B, the positive limiting stages $8_1$, $8_3$, $8_5$ limit the positive half-wave of the high-frequency signal, whereas the negative limiting stages $8_2$, $8_4$ and $8_6$ limit the negative half-wave of the high-frequency signal. Regarding the construction of the limiting stages $8_1$ to $8_6$, reference is made to the preceding figures of the drawings.

It is clearly evident that the limiter 2 according to the invention provides at least two positive limiting stages $8_1$, $8_3$, $8_5$, in this case, even three, which limit a positive half-wave of the high-frequency signal. It is also clearly evident that the limiter 2 according to the invention also provides at least two negative limiting stages $8_2$, $8_4$, $8_6$, in this case, even three, which limit a negative half-wave of the high-frequency signal. In this context, it is obvious that the limiter 2 according to the invention can provide not only one, or two, or three, or four, or five, but n limiting stages ($8_1$, $8_2$ to $8_n$), where n is a whole number, for every half-wave (positive, negative) of the high-frequency signal.

Furthermore, it is clearly evident that the at least two positive limiting stages $8_1$, $8_3$, $8_5$, in this case three, which limit the positive half-wave and/or that the at least two negative limiting stages $8_2$, $8_4$, $8_6$, in this case three, which limit the negative half-wave, are connected at different connecting points $12_1$, $12_2$, $12_3$ of the line element 9. In the exemplary embodiment from FIG. 3B, the limiting stages $8_1$, $8_2$ are connected to the connecting point $12_1$ of the line element 9. In this context, the limiting stages $8_3$ and $8_4$ are connected to the connecting point $12_2$ of the line element 9. Furthermore, the limiting stages $8_5$ and $8_6$ are connected to the connecting point $12_3$.

It is clearly evident that the individual connecting points $12_1$, $12_2$, $12_3$ are spaced from one another by the length Δs. In this context, the connecting point $12_2$ is distanced from the connecting point $12_1$ and from the connecting point $12_3$ in each case by the spacing distance Δs. In this context, the spacing distance Δs between each connecting point $12_1$, $12_2$, $12_3$ preferably amounts to one quarter of the wavelength of the high-frequency signal. For the case that the limiting stage $8_1$ limits a positive half-wave of the high-frequency signal, the voltage at the limiting point $12_1$ is brought down to the reference ground potential.

At the spacing distance of $\lambda/4$, there is again a maximum in the amplitude of the high-frequency signal. This allows the limiting stage $8_3$ or $8_4$ to act in a limiting manner. However, for the case that the frequency is low, the required spacing distance between every connecting point $12_1$ to $12_3$ cannot be maintained, so that a maximum in the amplitude of the high-frequency signal does not necessarily recur at the next connecting point $12_2$, $12_3$, however, the amplitude is still disposed above a threshold value from which the Zener diode $11_1$ to $11_6$ breaks down.

The spacing distance of the individual connecting points $12_1$, $12_2$ and $12_3$ can also amount to approximately zero wavelengths. This is possible, for example, for low frequencies. In this case, Beca. 50% of the energy is reflected by the limiting stages $8_1$, $8_3$, $8_5$ or $8_2$, $8_4$, $8_6$, approximately 30% of the energy is absorbed and approximately 20% of the energy transmitted.

It is also evident that, preferably at every connecting point $12_1$ to $12_3$, a positive limiting stage $8_1$, $8_3$, $8_5$ is connected, which limits a positive half-wave of the high-frequency signal and that, at every connecting point $12_1$ to $12_3$, a negative limiting stage $8_2$, $8_4$, $8_6$ is further connected, which limits a negative half-wave of the high-frequency signal. Every limiting stage $8_1$ to $8_6$ can, however, also be connected to a separate, that is, own connecting point $12_1$ to $12_3$. Overall, there can therefore be as many connecting points as there are limiting stages $8_1$ to $8_6$.

At the breakdown of a Zener diode $11_1$ to $11_6$, so that the Zener diode $11_1$ to $11_6$ of the adjacent limiting stage $8_1$ to $8_6$ also breaks down if possible, it is recommended to arrange the Zener diodes $11_1$ to $11_6$ and/or the diodes $10_1$ to $10_6$ as close to one another as possible. In the example from FIG. 3B, the first Zener diodes $11_1$, $11_3$ and $11_5$ and/or the first diodes $10_1$, $10_3$ and $10_5$ should be arranged as close to one another as possible. In the same manner, the second Zener diodes $11_2$, $11_4$ and $11_6$ and/or the second diodes $10_2$, $10_4$ and $10_6$ should also be arranged as close to one another as possible. In this context, arranged close to one another means that the thermal-power loss in a diode $10_1$ to $10_6$ and/or a Zener diode $11_1$ to $11_6$ heats up the adjacent diode/s $10_1$ to $10_6$ and/or Zener diode/s $11_1$ to $11_6$ so far that these also break down.

As a result of the fact that several positive limiting stages $8_1$, $8_3$ and $8_5$ and negative limiting stages $8_2$, $8_4$ and $8_6$ of the same type in each case are arranged in parallel, a higher power loss can be absorbed. For example, the arrangement from FIG. 3B can reflect powers from up to 10 W continuously without difficulty. In this context, up to 90% is reflected and a maximum of 2 W are absorbed. By selecting different Zener diodes $11_1$ to $11_6$ and/or different PIN diodes $10_1$ to $10_6$, however, these values can be shifted.

Furthermore, the limiter 2 according to the invention also provides a not illustrated gap pad which is arranged as far as possible in an airtight manner on the at least one limiting stage 8, ideally on all limiting stages $8_1$ to $8_6$ for heat removal. In this context, the gap pad is preferably attached with an adhesive to the limiting stages $8_1$ to $8_6$.

Figure 4A:
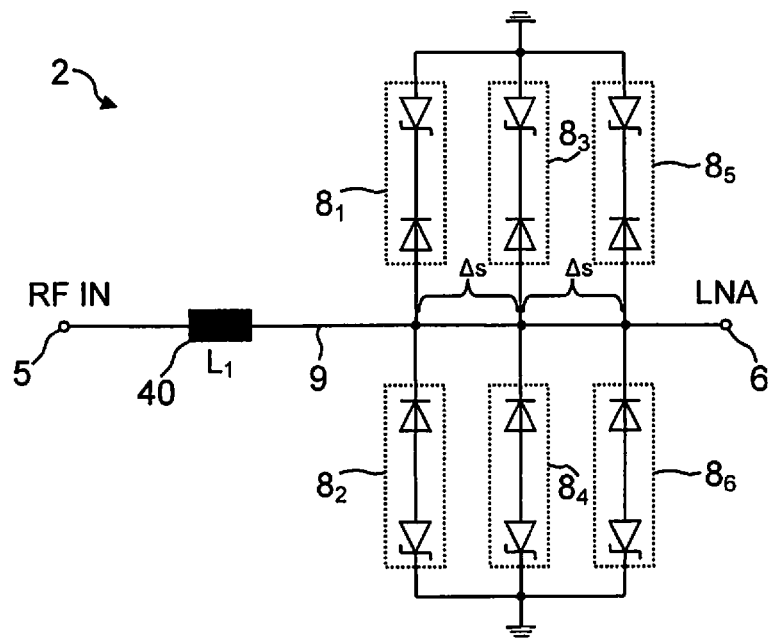
FIG. 4A a limiter according to the invention which provides six limiting stages arranged in parallel which limit a positive half-wave and a negative half-wave of the high-frequency signal and which additionally contains an inductance for compensation.

FIG. 4A shows a limiter 2 according to the invention which provides six limiting stages $8_1$ to $8_6$ arranged in parallel which limit a positive half-wave and a negative half-wave of the high-frequency signal and which additionally contains a first inductance 40 for the compensation. In this context, the first inductance 40 is connected at one end to the input 5 and at the other end to the line element 9. It can also be said that the first inductance 40 is connected into the line element 9. The first inductance 40 can also be connected at one end to the output 6 and at the other end to the line element 9. In this context, the level of the first inductance 40 is preferably selected in such a manner that the depletion-layer capacitance of every diode $10_1$ to $10_6$ and of every Zener diode $11_1$ to $11_6$ within every limiting stage $8_1$ to $8_6$ is compensated for a first operating frequency. If the high-frequency signal is a broadband signal, the level of the first inductance 40 is preferably selected in such a manner that the depletion-layer capacitances are compensated for the mid-frequency of the high-frequency signal. In this context, the first inductance 40 is preferably also soldered onto the limiter 2 according to the invention embodied as a printed circuit board. The first inductance 40 can also be embodied through the guiding of the strip conductor on the printed circuit board. In this context, a meandering strip-conductor construction increases the inductance of the strip conductor.

Figure 4B:
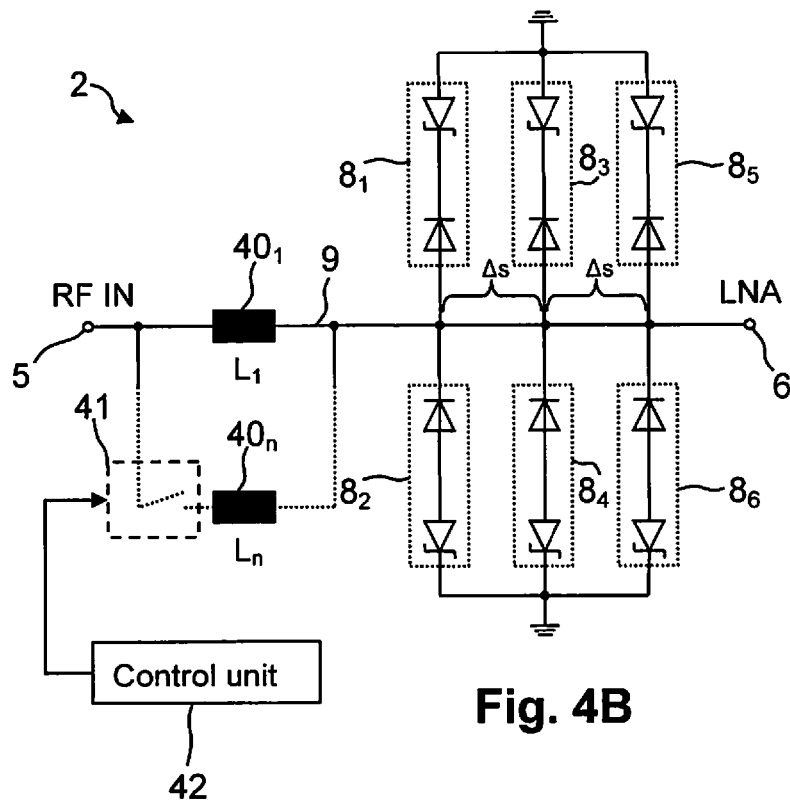
FIG. 4B a further limiter according to the invention which provides six limiting stages arranged in parallel which limit a positive half-wave and a negative half-wave of the high-frequency signal and which additionally contains several inductances for compensation which can be connected and disconnected via a switch.

FIG. 4B shows a further limiter 2 according to the invention which provides six limiting stages $8_1$ to $8_6$ arranged in parallel which limit a positive half-wave and a negative half-wave of the high-frequency signal and which additionally contains several inductances $40_n$ for the compensation which can be connected and disconnected via a switch 41. In the exemplary embodiment of FIG. 4B, the first inductance $40_1$ is connected to the input 5 of the limiter 2 according to the invention and to the line element 9. In parallel with this first inductance $40_1$, n further inductances $40_n$, where n≥1 and is a whole number, can be connected or disconnected. In this context, the further n inductances can be connected to the first inductance $40_1$ or disconnected from the latter individually or jointly with a switch 41. In this context, the switch 41 is operated, for example, from the control unit 42. The switch 41 can be constructed, for example, by means of a PIN diode. It is also possible that the switch 41 is a manual switch, which is adjusted manually by a user. In this case, the limiter 2 according to the invention can also compensate the depletion-layer capacitances of all limiting stages $8_1$ to $8_6$ for a different operating frequency, even if all of the voltage sources in the radio device 1 are switched off. Through addition of one or some or all of the inductances $40_n$ additionally connected in parallel, the depletion-layer capacitances of the limiting stages $8_1$ to $8_6$ can be compensated for further respectively different operating frequencies.

Figure 4C:
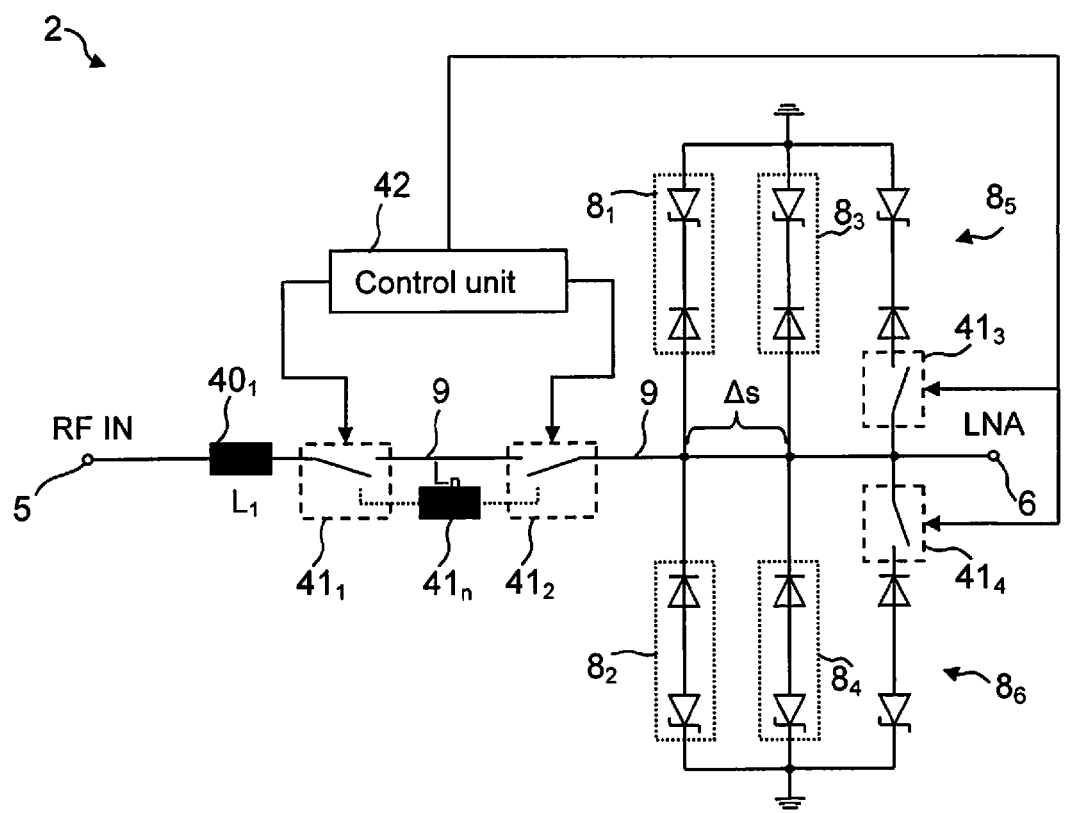
FIG. 4C a further limiter according to the invention which provides six limiting stages arranged in parallel which limit a positive half-wave and a negative half-wave of the high-frequency signal of which at least two limiting stages can be connected and disconnected and which additionally contains several inductances for compensation which can be connected and disconnected via a switch.

FIG. 4C shows a further limiter 2 according to the invention which provides six limiting stages $8_1$ to $8_6$ arranged in parallel which limit a positive half-wave and a negative half-wave of the high-frequency signal, whereas at least two limiting stages $8_5$, $8_6$ can be connected and disconnected, and whereas the limiter 2 according to the invention additionally contains several inductances $40_n$ for the compensation which can be connected and disconnected via switches $41_1$, $41_2$, $41_3$, $41_4$. It is clearly evident that the limiter 2 according to the invention provides a first inductance $40_1$ and at least one further inductance $40_n$ which, in the exemplary embodiment from FIG. 4C, can be connected in series. The at least one further inductance $40_n$ relates to one or more single inductances. The at least one further inductance $40_n$ can be connected via the two switches $41_1$ and $41_2$ in series to the first inductance $40_1$. For the case that the inductance $40_n$ comprises a plurality of individual inductances, one of these inductances or several of these inductances or all of these inductances $40_n$ can be connected in series to the first inductance $40_1$ via the switches $41_1$ and $41_2$.

In this context, it is obvious that the further inductances $40_n$ can be connected not only in series to the first inductance $40_1$, but also at the same time, additionally, in parallel to the first inductance $40_1$, as has already been explained in FIG. 4B.

Furthermore, in the limiter 2 according to the invention from FIG. 4C, the at least one limiting stage $8_5$, $8_6$ in each case, which serves to limit the positive and the negative half-wave, can be connected to the high-frequency signal-line element 9 or disconnected from the latter. For example, the positive limiting stage $8_5$ can be electrically connected to the line element 9 or separated from the latter by means of the switch $41_3$. The same applies for the negative limiting stage $8_6$ which can be electrically connected to the line element 9 or electrically separated from the latter via the switch $41_4$. It is also possible for further limiting stages $8_1$ to $8_6$ respectively to $8_n$ to be connected to the line elements 9 by means of switches. All of the switches $41_1$ to $41_4$ can be constructed, for example, by PIN diodes and controlled by the control unit 42. The switches $41_1$ to $41_4$ can also comprise manual switching bridges, which are adjusted by a user. This also allows the depletion-layer capacitances of the individual limiting stages $8_1$ to $8_6$ to be compensated continuously without energy supply for a plurality of operating frequencies.

Furthermore, it would also be possible for a suitable compensation inductance to be integrated directly within every limiting stage. However, in this case, the readjustment for different operating frequencies would no longer be possible.

Accordingly, the limiter 2 according to the invention functions in a temperature range from −40° C. to +85° C. without difficulty. The limiter 2 according to the invention is preferably constructed by means of a printed-circuit board. Alongside the already mentioned gap pad, recesses in the printed-circuit board can be present directly under the diodes $10_1$ to $10_6$ and/or directly under the Zener diodes $11_1$ to $11_6$, into which a copper inlay (German: Kupfereinlage) which further reduces the thermal-transfer resistance is fitted.

The illustrated limiter 2 according to the invention is preferably integrated directly on a chip. Accordingly, a reduced space requirement is necessary, and the heat removal is improved. The power subdivision can be distributed between the individual elements in an improved manner.

Furthermore, all positive limiting stages $8_1$, $8_3$, $8_5$ which limit the positive half-waves of the high-frequency signal, are preferably constructed in an identical manner. The same also applies for all negative limiting stages $8_2$, $8_4$, $8_6$ which limit the negative half-wave of the high-frequency signal. However, it is also possible for individual limiting stages $8_1$ to $8_6$ to provide different diodes $10_1$ to $10_6$ and/or different Zener diodes $11_1$ to $11_6$ which have different break down voltages and/or can absorb different energies.

The limiting stages can also be constructed in such a manner that the position of the diodes $10_1$ to $10_6$ and of the Zener diodes $11_1$ to $11_6$ are exchanged. In this case, the Zener diodes $11_1$ to $11_6$ are electrically connected via the connecting points $12_1$ to $12_3$ to the line element 9, whereas the diodes $10_1$ to $10_6$ are electrically connected to the reference ground.

All of the features described and/or illustrated can be combined arbitrarily with one another within the scope of the invention. The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A limiter for high-frequency signals, comprising:
an input for receiving a high-frequency signal;
at least two positive limiting stages, which are electrically connected to the input and which limit a positive half-wave of the high-frequency signal, and/or at least two negative limiting stages, which are electrically connected to the input and which limit a negative half-wave of the high-frequency signal; and
an output electrically connected to the input via a line element,
wherein the at least two positive limiting stages each include a first series circuit with a first unbiased diode and a first Zener diode, which does not serve to bias the first unbiased diode, so that the high-frequency signal is electrically connected to a reference ground via the first unbiased diode and the first Zener diode, and/or wherein the at least two negative limiting stages each include a second series circuit with a second unbiased diode and a second Zener diode, which does not serve to bias the second unbiased diode, so that the high-frequency signal is electrically connected to the reference ground via the second unbiased diode and the second Zener diode,
wherein the high-frequency signal is present at an anode of the first unbiased diode, a cathode of the first unbiased diode is electrically connected to a cathode of the first Zener diode, and an anode of the first Zener diode is electrically connected to the reference ground, and/or wherein the high-frequency signal is present at a cathode of the second unbiased diode, an anode of the second unbiased diode is electrically connected to an anode of the second Zener diode, and a cathode of the second Zener diode is electrically connected to the reference ground, and
wherein the at least two positive limiting stages and/or the at least two negative limiting stages are connected at different connecting points of the line element.

2. The limiter according to claim 1, wherein the at least two positive limiting stages, which limit a positive half-wave of the high-frequency signal, are constructed in an identical manner and/or wherein the at least two negative limiting stages, which limit a negative half-wave of the high-frequency signal, are constructed in an identical manner.

3. The limiter according to claim 1, wherein a spacing distance between each connecting point is approximately one quarter of a wavelength of the high-frequency signal or wherein the spacing distance between each connecting point is approximately zero wavelengths of the high-frequency signal.

4. The limiter according to claim 1, wherein a positive limiting stage, which limits a positive half-wave of the high-frequency signal, is connected at each connecting point, and
wherein a negative limiting stage, which limits a negative half-wave of the high-frequency signal, is further connected at each connecting point.

5. The limiter according to claim 1, wherein a first inductance is connected to the line element, wherein an inductance level of the first inductance is selected in such a manner that the depletion-layer capacitance of every unbiased diode and every Zener diode within every limiting stage is compensated for a first operating frequency.

6. The limiter according to claim 5, wherein via at least one switch, in each case, at least one additional inductance is connected in parallel to or in series with the first inductance, wherein the inductance level of the at least one additional inductance is selected in such a manner that the depletion-layer capacitance of each unbiased diode and each Zener diode within every limiting stage is compensated for a different operating frequency.

7. The limiter according to claim 1, wherein via further switches, the at least two positive limiting stages and/or the at least two negative limiting stages are connected in a detachable manner to the line element.

8. The limiter according to claim 1, wherein each unbiased diode is a PIN diode.

9. The limiter according to claim 1, wherein no additional elements are connected within each limiting stage and/or to each limiting stage in series with each unbiased diode and each Zener diode and/or wherein, with the exception of further limiting stages, no additional elements are connected within each limiting stage and/or to each limiting stage in parallel to each unbiased diode and each Zener diode.

10. The limiter according to claim 9, wherein the first and/or second unbiased diodes and the first and/or second Zener diodes are at least one of active components and passive components.

11. The limiter according to claim 1, further comprising a gap pad arranged in an airtight manner on the at least one limiting stage for heat removal.

12. A radio device for mobile communications comprising;
an antenna; and
a limiter according to claim 1,
wherein the antenna is connected to the input of the limiter or wherein the antenna is connected via a bandpass to the input of the limiter.

13. The limiter according to claim 10, wherein the active components are transistors and the passive components are capacitors.

14. The limiter according to claim 1, wherein each unbiased diode and/or each Zener diode provide a metal electrode leadless face construction.

15. The limiter according to claim 1, further comprising a printed-circuit board on which the at least two positive limiting stages and/or the at least two negative limiting stages are arranged.

* * * * *